(12) United States Patent
Duesterberg

(10) Patent No.: US 10,348,325 B2
(45) Date of Patent: Jul. 9, 2019

(54) MEASURING DEVICE AND ELECTRICAL CONTROLLER

(71) Applicant: Lenze Automation GmbH, Aerzen (DE)

(72) Inventor: Dirk Duesterberg, Emmerthal (DE)

(73) Assignee: Lenze Automation GmbH, Aerzen (DE)

( * ) Notice: Subject to any disclaimer, the term of this patent is extended or adjusted under 35 U.S.C. 154(b) by 0 days.

(21) Appl. No.: 15/998,540

(22) Filed: Aug. 16, 2018

(65) Prior Publication Data

US 2019/0058488 A1 Feb. 21, 2019

(30) Foreign Application Priority Data

Aug. 16, 2017 (DE) .................. 10 2017 214 295

(51) Int. Cl.
  *H03M 3/00* (2006.01)
  *H03M 1/12* (2006.01)
  *H03M 7/32* (2006.01)
  *H03M 1/10* (2006.01)

(52) U.S. Cl.
  CPC .......... *H03M 3/458* (2013.01); *H03M 1/1071* (2013.01); *H03M 1/12* (2013.01); *H03M 7/304* (2013.01)

(58) Field of Classification Search
  CPC .......... H03M 3/30; H03M 7/304; H03M 1/12
  USPC .......................... 341/143, 155, 156, 120, 77
  See application file for complete search history.

(56) References Cited

U.S. PATENT DOCUMENTS 6,587,062 B1 * 7/2003 Reinhold .................. G06F 3/05
  341/143

* cited by examiner

*Primary Examiner* — Joseph J Lauture
(74) *Attorney, Agent, or Firm* — Crowell & Moring LLP

(57) ABSTRACT

A measuring device includes a delta-sigma modulator configured to take an analog signal as a basis for generating a bit stream, and an evaluation unit that receives the bit stream from the delta-sigma modulator and evaluates the received bit stream. The measuring device has a single data transmission line, wherein the delta-sigma modulator is configured to transmit the bit stream to the evaluation unit via the single data transmission line using a transmit clock, and wherein the evaluation unit is configured to reconstruct the transmit clock and/or a phase of bits within the bit stream from the received bit stream and to extract the bits from the received bit stream based on the reconstructed transmit clock and/or based on the reconstructed phase.

9 Claims, 1 Drawing Sheet

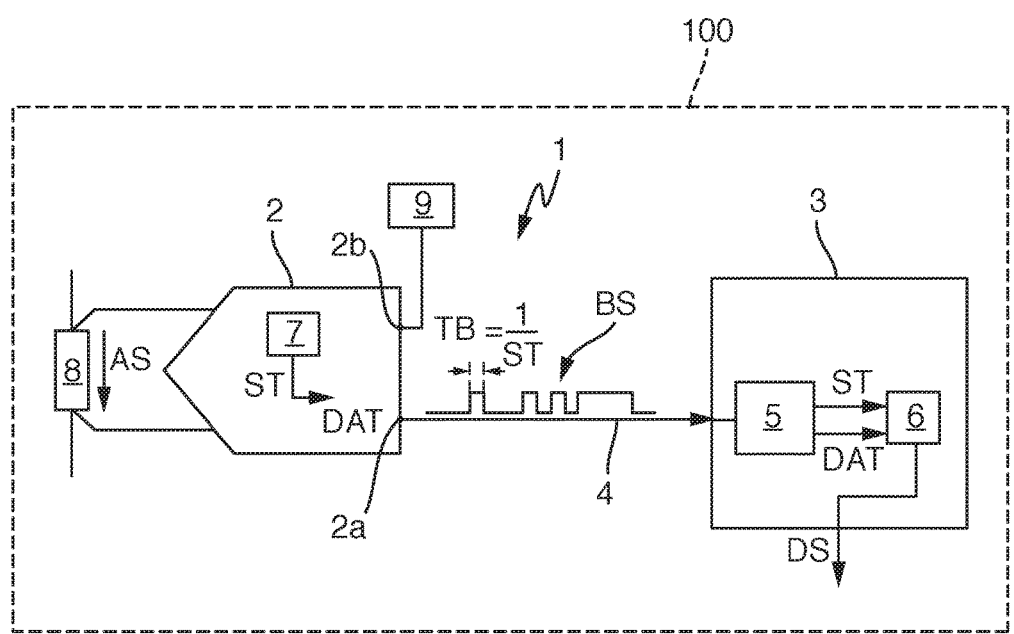

MEASURING DEVICE AND ELECTRICAL CONTROLLER

CROSS REFERENCE TO RELATED APPLICATION

This application claims priority under 35 U.S.C. § 119 from German Patent Application No. 10 2017 214 295.2, filed Aug. 16, 2017, the entire disclosure of which is herein expressly incorporated by reference.

BACKGROUND AND SUMMARY OF THE INVENTION

The invention relates to a measuring device and an electrical controller having such a measuring device.

When electrical controllers use delta-sigma modulators for example for A/D conversion, a high-frequency clock signal is typically transmitted to a clock input connection of the delta-sigma modulator. The clock signal can be generated in control electronics or an evaluation unit and routed across one or more plug connections to a printed circuit board on which the delta-sigma modulator is arranged, in order to capture analog signals there. The clock signal typically has a frequency in a range from approximately 10 MHz to 20 MHz. The rise time of an edge of the clock signal should be steep enough to produce as little jitter as possible and not to unnecessarily impair the performance of the conversion. These clock signal properties can lead to undesirable interference emissions.

The invention is based on the object of providing a measuring device and an electrical controller that have preferably low interference emissions.

The invention achieves this object by means of a measuring device having: a delta-sigma modulator configured to take an analog signal as a basis for generating a bit stream; and an evaluation unit that receives the bit stream from the delta-sigma modulator and evaluates the received bit stream, wherein the measuring device has a single data transmission line, the delta-sigma modulator is configured to transmit the bit stream to the evaluation unit via the data transmission line using a transmit clock, and the evaluation unit is configured to reconstruct the transmit clock and/or a phase of bits within the bit stream from the received bit stream and to extract the bits from the received bit stream based on the reconstructed transmit clock and/or based on the reconstructed phase. The invention further achieves this object by means of an electrical controller having the measuring device, which is configured to convert the analog signal into a digital signal, and wherein operation of the electrical controller is controlled on the basis of the digital signal.

The measuring device has a delta-sigma modulator that is conventionally configured to take an analog signal as a basis for generating a bit stream. The delta-sigma modulator may be of $1^{st}$, $2^{nd}$ or $3^{rd}$ order, for example. In this respect, reference may also be made to the relevant technical literature.

The measuring device further has an evaluation unit, configured separately from the delta-sigma modulator, that receives the bit stream from the delta-sigma modulator and evaluates the received bit stream, for example uses digital low-pass filtering to generate a digital signal having a word length comprising multiple bits. In this respect, reference may also be made to the relevant technical literature.

The measuring device has a single data transmission line between delta-sigma modulator and evaluation unit. In other words, the delta-sigma modulator and the evaluation unit are connected to one another for the purpose of data interchange only by means of a single electrical line.

The delta-sigma modulator is configured to transmit the bit stream, for example asynchronously, to the evaluation unit via the data transmission line using a prescribable or prescribed transmit clock. The transmit clock can be chosen to be between 1 MHz and 10 MHz, for example.

The evaluation unit is configured to reconstruct the transmit clock and/or a phase of the bits of the bit stream from the received bit stream and to extract the bits from the received bit stream or useful bits from the received bit stream based on the reconstructed transmit clock and/or the reconstructed phase. The reconstructed phase may be the phase of the received bits referenced to a clock system of the evaluation unit.

According to the invention, a separate clock signal on a clock line designed specifically therefor is not used. Instead, the evaluation unit synchronizes itself to the bit stream.

The invention is based on the insight that a useable dynamic range of the delta-sigma modulator is approximately 80% of the maximum modulation. If the delta-sigma modulator is used for overcurrent detection, for example, overcurrent disconnection typically begins from this order of magnitude. Up to 80%, a $2^{nd}$-order delta-sigma modulator involves no more than approximately 10 identical bits being successively transmitted on the data transmission line. Thereafter, a state change for the transmitted bits typically takes place for normally a single bit. An ensuing bit sequence may have the following appearance, for example: " . . . 11111111011111110111 . . . "

Those bits whose state changes are consistent with a conventional start bit or stop bit and can thus be used for synchronizing the data transmission in the receiver or the evaluation unit, as takes place in the case of asynchronous communication by means of a UART (Universal Asynchronous Receiver Transmitter), for example. Synchronization in the evaluation unit can take place on every edge of the bit stream, for example. In this respect, reference may also be made to the relevant specialist literature on the subject UART.

By omitting the clock line that is conventionally used, it is possible for lines to be saved. Additionally, the interference emission is decreased, since no clock signal is transmitted.

In one embodiment, the evaluation unit is configured to take the received bit stream as a basis for generating a digital signal consistent with the analog signal in digital representation. The digital signal can have a resolution of 8, 16 or 32 bits, for example.

In one embodiment, the evaluation unit has a clock recovery unit configured to reconstruct the transmit clock and/or the phase and/or the bits of the bit sequence and/or useful bits of the bit sequence from the received bit stream.

In one embodiment, the evaluation unit has a digital filter that digitally filters the (useful) bits extracted from the received bit stream. The digital filter can further conventionally perform a sampling rate reduction in order to adjust an oversampling ratio in suitable fashion. In this respect, reference may also be made to the relevant specialist literature.

In one embodiment, the delta-sigma modulator has a clock generator for generating a modulator clock, wherein the delta-sigma modulator is configured to generate the bit stream using the modulator clock. Alternatively or additionally, the delta-sigma modulator can have a clock input connection for supply with an external clock signal, wherein the delta-sigma modulator is configured to generate the bit stream on the basis of the externally applied clock signal.

The invention further relates to an electrical controller having a measuring device as described above configured to convert the analog signal, which maps a motor current, for example, into the digital signal. The electrical controller controls its operation on the basis of the digital signal.

The electrical controller may be a frequency converter or servo converter.

Other objects, advantages and novel features of the present invention will become apparent from the following detailed description of one or more preferred embodiments when considered in conjunction with the accompanying drawing.

BRIEF DESCRIPTION OF THE DRAWING

FIG. 1 shows an electrical controller having a measuring device, in which data are transmitted between a delta-sigma modulator and an evaluation unit via a single-wire interface.

DETAILED DESCRIPTION OF THE DRAWING

FIG. 1 shows an electrical controller 100 in the form of a frequency converter having a measuring device 1. The measuring device 1 converts a voltage AS present across a measurement resistor 8 into a digital signal DS, i.e. the measuring device 1 serves as an analog-to-digital converter.

The voltage AS present across the measurement resistor 8 is proportional to a motor current to be measured, for example, so that the electrical controller 100 can regulate a motor current, for example, based on the digital signal DS.

The measuring device 1 has a delta-sigma modulator 2 configured to take the analog signal AS as a basis for conventionally generating a chronological succession of bits or a bit stream BS at a data output 2a. In this respect, reference may also be made to the relevant technical literature known to those of skill in the art.

The measuring device 1 further has an evaluation unit 3 that receives the bit stream BS from the delta-sigma modulator 2 and evaluates the received bit stream BS to generate the digital signal DS. In this respect, reference may likewise be made to the relevant technical literature.

The measuring device 1 has a single data transmission line 4 via which the bit stream BS generated by way of the delta-sigma modulator 2 is transmitted to the evaluation unit 3.

The delta-sigma modulator 2 is configured to transmit the bit stream BS to the evaluation unit 3 via the data transmission line 4 using a transmit clock ST, but without this involving an additional piece of clock information being transmitted from the delta-sigma modulator 2 to the evaluation unit 3. In particular, no separate clock line is provided therefor. Instead, the evaluation unit 3 is configured to reconstruct the transmit clock ST and/or a phase of bits within the bit stream BS referenced to an internal clock of the evaluation unit 3 from the received bit stream BS and to extract the bits from the received bit stream BS based on the reconstructed transmit clock ST and/or the reconstructed phase, as basically also takes place in the case of receivers of asynchronous interfaces.

To this end, the evaluation unit 3 has a clock recovery unit 5 configured to reconstruct the transmit clock ST and/or the phase from the received bit stream BS and to output the transmit clock ST and reconstructed (useful) bits of the bit stream BS to a digital filter 6 that uses digital filtering to generate the digital signal DS.

The delta-sigma modulator 2 can have an optional clock generator 7 for generating a modulator clock, wherein the delta-sigma modulator 2 then generates and transmits the bit stream BS using the modulator clock ST. The modulator clock and the transmit clock may be identical.

Alternatively or additionally, the delta-sigma modulator 2 can have a clock input connection 2b for supply with an external clock signal, wherein the delta-sigma modulator 2 is then configured to generate the bit stream BS on the basis of the external clock signal. The external clock signal can be generated by a clock source 9 of the electrical controller.

The evaluation unit 3 and, if need be, further elements of the electrical controller 100 may be integrated in an FPGA.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:
1. A measuring device, comprising:
a delta-sigma modulator configured to take an analog signal as a basis for generating a bit stream; and
an evaluation unit that receives the bit stream from the delta-sigma modulator (2) and evaluates the received bit stream,
wherein
the measuring device has a single data transmission line,
the delta-sigma modulator is configured to transmit the bit stream to the evaluation unit via the data transmission line using a transmit clock, and
the evaluation unit is configured to reconstruct the transmit clock and/or a phase of bits within the bit stream from the received bit stream and to extract the bits from the received bit stream based on the reconstructed transmit clock and/or based on the reconstructed phase.
2. The measuring device as claimed in claim 1, wherein the evaluation unit is configured to take the received bit stream as a basis for generating a digital signal consistent with the analog signal in digital representation.
3. The measuring device as claimed in claim 1, wherein the evaluation unit has a clock recovery unit configured to reconstruct the transmit clock and/or the phase from the received bit stream.
4. The measuring device as claimed in claim 1, wherein the evaluation unit has a digital filter that digitally filters the bits extracted from the received bit stream.
5. The measuring device as claimed in claim 1, wherein the delta-sigma modulator has a clock generator for generating a modulator clock, wherein the delta-sigma modulator is configured to generate the bit stream using the modulator clock.
6. The measuring device as claimed in claim 1, wherein the delta-sigma modulator has a clock input connection for supply with an external clock signal, wherein the delta-sigma modulator is configured to generate the bit stream on the basis of the external clock signal.
7. The measuring device as claimed in claim 1, wherein the evaluation unit has an FPGA.
8. An electrical controller, comprising:
a measuring device as claimed in claim 1, wherein the measuring device is configured to convert the analog signal into a digital signal, and wherein operation of the electrical controller is controlled on the basis of the digital signal.

9. The electrical controller as claimed in claim 8, wherein the electrical controller is a frequency converter or servo converter.

* * * * *